(12) United States Patent
Joet

(10) Patent No.: US 11,661,336 B2
(45) Date of Patent: May 30, 2023

(54) METHOD FOR MANUFACTURING AN ELECTROACOUSTIC TRANSDUCER

(71) Applicant: COMMISSARIAT À L'ÉNERGIE ATOMIQUE ET AUX ÉNERGIES ALTERNATIVES, Paris (FR)

(72) Inventor: Loïc Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 58 days.

(21) Appl. No.: 17/487,775

(22) Filed: Sep. 28, 2021

(65) Prior Publication Data
US 2022/0098031 A1 Mar. 31, 2022

(30) Foreign Application Priority Data
Sep. 29, 2020 (FR) ...................................... 2009921

(51) Int. Cl.
*H04R 19/04* (2006.01)
*B81C 1/00* (2006.01)
*B81B 3/00* (2006.01)
*H04R 31/00* (2006.01)

(52) U.S. Cl.
CPC ........ *B81C 1/00158* (2013.01); *B81B 3/0021* (2013.01); *H04R 31/003* (2013.01); *H04R 31/006* (2013.01); *B81B 2201/0257* (2013.01); *B81B 2203/0127* (2013.01); *H04R 2201/003* (2013.01)

(58) Field of Classification Search
CPC ............ H04R 19/005; H04R 2201/003; B81B 2203/0181; B81B 2203/058; B81C 1/00174
See application file for complete search history.

(56) References Cited

U.S. PATENT DOCUMENTS

| 7,578,190 | B2 * | 8/2009 | Lin | ........................ G01P 15/125 |
| | | | | 73/514.32 |
| 10,257,615 | B2 * | 4/2019 | Joet | ........................... H04R 7/24 |
| 10,807,858 | B2 * | 10/2020 | Joet | ........................ H04R 31/00 |
| 11,337,016 | B2 * | 5/2022 | Joet | ........................ H04R 17/02 |

(Continued)

FOREIGN PATENT DOCUMENTS

| EP | 2 541 222 A1 | 1/2013 |
| EP | 3 070 963 A1 | 9/2016 |

(Continued)

OTHER PUBLICATIONS

Search Report as issued in French Patent Application No. 2009921, dated Jun. 14, 2021.

*Primary Examiner* — Ryan Robinson
(74) *Attorney, Agent, or Firm* — Pillsbury Winthrop Shaw Pittman LLP

(57) ABSTRACT

A method for manufacturing an electroacoustic transducer includes a frame; an element moveable with respect to the frame, the moveable element including a membrane and a structure for rigidifying the membrane; a first transmission arm, the moveable element being coupled to an end of the first transmission arm; wherein a shield is used to protect the rigidification structure during a step of etching a substrate, the etching of the substrate making it possible to delimit the first transmission arm and to lighten the moveable element.

12 Claims, 7 Drawing Sheets

(56) References Cited

U.S. PATENT DOCUMENTS

| | | | | |
|---|---|---|---|---|
| 2013/0000411 A1* | 1/2013 | Robert | ............... | G01L 9/0052 |
| | | | | 73/731 |
| 2014/0060169 A1* | 3/2014 | McNeil | ............... | G01L 9/12 |
| | | | | 73/718 |
| 2020/0216305 A1* | 7/2020 | Rizzini | ............... | G01C 19/5712 |
| 2021/0292158 A1* | 9/2021 | Dagher | ............... | H04R 19/005 |
| 2022/0098032 A1* | 3/2022 | Joet | ............... | H04R 19/005 |

FOREIGN PATENT DOCUMENTS

| | | |
|---|---|---|
| EP | 3 557 881 A1 | 10/2019 |
| FR | 3 059 659 A1 | 6/2018 |

* cited by examiner

METHOD FOR MANUFACTURING AN ELECTROACOUSTIC TRANSDUCER

CROSS-REFERENCE TO RELATED APPLICATIONS

This application claims priority to French Patent Application No. 2009921, filed Sep. 29, 2020, the entire content of which is incorporated herein by reference in its entirety.

FIELD

The technical field of the invention is that of MEMS (microelectromechanical system) or NEMS (nanoelectromechanical system) type devices. The invention more particularly relates to a method for manufacturing an electroacoustic transducer comprising a device for transmitting a movement and a force between two zones isolated from each other in a sealed manner. Such an electroacoustic transducer may be employed as microphone or loudspeaker.

BACKGROUND

Microelectromechanical or nanoelectromechanical microphones represent a rapidly expanding market, notably thanks to the development of mobile devices, such as tablets, smartphones and other connected objects, in which they are replacing little by little electret microphones.

Microphones measure a rapid variation in atmospheric pressure, also called acoustic pressure. They thus comprise at least one portion in contact with the exterior.

Most MEMS or NEMS microphones currently manufactured are capacitive detection microphones. The patent application FR3059659 describes an example of capacitive detection microphone comprising a moveable element, capacitive detection means and a device for transmitting a movement between the moveable element and the capacitive detection means.

The moveable element is capable of collecting the variation in pressure. It may be formed by a rigid piston comprising a membrane, also called thin layer, and a structure for rigidifying the membrane. The membrane forms a separation between a cavity open onto the external environment and a rear volume of the microphone, also called reference volume because a reference pressure reigns therein. Thus, a face of the membrane is subjected to the reference pressure and an opposite face of the membrane is subjected to atmospheric pressure (of which it is wished to detect the variation). The moveable element is connected to the movement transmitting device in a first zone of the microphone.

The capacitive detection means make it possible to measure the displacement of the piston, and thus the variation in pressure. They are arranged in a second zone isolated from the first zone in a sealed manner. They comprise a moveable electrode and at least one fixed electrode arranged opposite the moveable electrode. The electrodes form the armatures of a capacitor, the capacitance of which varies as a function of the displacement of the piston. The second zone is chamber under a controlled atmosphere (typically under vacuum) to reduce phenomena of viscous friction and associated noises.

The transmitting device comprises at least one first transmission arm extending into the first zone and at least one second transmission arm extending into the second zone. The piston is coupled to a first end of the first transmission arm, whereas the moveable electrode of the capacitive detection means is coupled to an end of the second transmission arm. The first and second transmission arms are connected to their second end through a pivot articulation. This pivot articulation authorises a rotation of the transmission arms with respect to the frame of the microphone and simultaneously ensures the seal between the first and second zones.

The manufacture of such a microphone notably comprises a step of trimming the piston and a step of delimiting the transmission arms, in order to make them moveable with respect to the frame. These steps are difficult to implement without piercing the piston and creating important air leakages between the cavity subjected to atmospheric pressure and the rear volume of the microphone (subjected to the reference pressure).

SUMMARY

More generally, there exists a need to manufacture an electroacoustic transducer while limiting air leakages between the different volumes of the electroacoustic transducer, the electroacoustic transducer comprising:
 a frame;
 an element moveable with respect to the frame, the moveable element comprising a membrane and a structure for rigidifying the membrane;
 a first transmission arm, the moveable element being coupled to an end of the first transmission arm.

According to a first aspect of the invention, this need tends to be satisfied by providing a manufacturing method comprising the following steps:
 providing a stack successively comprising a substrate, a first sacrificial layer and a first structural layer;
 forming a second sacrificial layer on the first structural layer, the second sacrificial layer comprising first and second disjointed portions;
 forming a second structural layer on the first structural layer and the second sacrificial layer;
 etching the second structural layer so as to expose the first portion of the second sacrificial layer and to delimit the rigidification structure of the moveable element, the second portion of the second sacrificial layer being encapsulated by the rigidification structure;
 etching the first structural layer to the first sacrificial layer so as to delimit the membrane of the moveable element;
 etching the first portion of the second sacrificial layer so as to expose a first face of the membrane and to etch a portion of the first sacrificial layer, thereby forming a cavity which extends under the rigidification structure;
 etching the substrate so as to delimit the first transmission arm and to release at least partially the moveable element while opening into the cavity, the first sacrificial layer and the second portion of the second sacrificial layer serving as stop layer to the etching;
 etching the first sacrificial layer so as to expose a second opposite face of the membrane.

The second portion of the second sacrificial layer, encapsulated in the structure for rigidifying the membrane, serves as protective layer or shield against the etching of the rigidification structure during the step of etching the substrate. Thus, the creation of (supplementary) air leakages through the moveable element or piston is prevented.

Thanks to the second portion of the second sacrificial layer, it is further possible to reduce the overlap distance between the substrate and the rigidification structure, thereby decreasing the phenomenon of squeeze-film damping responsible for mechanical noise.

In an embodiment, the second portion of the second sacrificial layer extends around the membrane of the moveable element, over more than 80% of the periphery of the moveable element, and beneficially all around the membrane of the moveable element.

In an embodiment of the manufacturing method, the second sacrificial layer further comprises a third portion disjointed from the first and second portions, the third portion of the second sacrificial layer is arranged so as to be encapsulated by a remaining portion of the second structural layer after the step of etching the second structural layer and the third portion of the second sacrificial layer also serves as stop layer during the step of etching the substrate.

The third portion of the second sacrificial layer is beneficially situated in the vicinity of an intersection between the position of the first transmission arm and the periphery of the rigidification structure.

The manufacturing method may further comprise, after the step of etching the first and second sacrificial layers and before the step of etching the substrate, the following steps:
  arranging a cover on the second structural layer, thereby forming an assembly; and
  turning over the assembly.

Apart from the characteristics that have been mentioned in the preceding paragraphs, the manufacturing method according to the invention may have one or more complementary characteristics among the following, considered individually or according to all technically possible combinations thereof:
  the first structural layer and the second structural layer are etched simultaneously so as to delimit the membrane and the rigidification structure of the moveable element;
  the stack is a multilayer structure of silicon on insulator (SOI) type;
  the substrate is made of silicon, the first sacrificial layer is made of silicon oxide and the first structural layer is made of silicon;
  the second sacrificial layer is made of silicon oxide;
  the first structural layer has a thickness comprised between 100 nm and 10 µm;
  the rigidification structure of the moveable element rests at least in part on the membrane; and
  the rigidification structure of the moveable element is in contact with the membrane.

A second aspect of the invention relates to an electroacoustic transducer comprising:
  a frame;
  an element moveable with respect to the frame, the moveable element comprising a membrane and a structure for rigidifying the membrane;
  a first transmission arm, the moveable element being coupled to an end of the first transmission arm;
the membrane being formed by a first portion of a first structural layer, the rigidification structure being formed by a first portion of a second structural layer arranged on the first structural layer and the frame comprising a substrate, a second portion of the first structural layer and a second portion of the second structural layer,
and wherein the substrate and the rigidification structure are superimposed over a distance less than 10 µm, the distance being measured in a transversal sectional plane of the rigidification structure.

In an embodiment, the transducer comprises a device for transmitting a movement and a force between a first zone and a second zone with a controlled atmosphere, the first and second zones being isolated from each other in a sealed manner, the transmitting device comprising, apart from the first transmission arm which extends into the first zone, a second transmission arm extending into the second zone.

The invention and the applications thereof will be better understood on reading the description that follows and by examining the figures that accompany it.

BRIEF DESCRIPTION OF THE FIGURES

Other characteristics and benefits of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION

Figure 1:
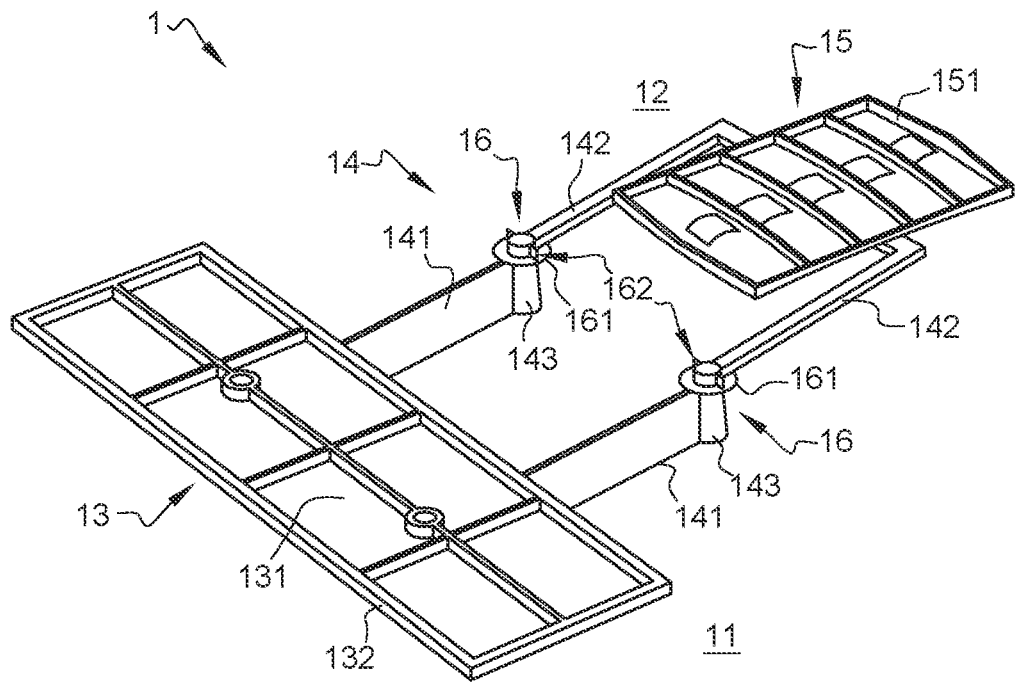
FIG. 1 schematically and partially represents an example of electroacoustic transducer comprising a piston connected to two first transmission arms.

FIG. 1 shows an example of electroacoustic transducer 1, of capacitive detection microphone type, of which it is sought to simplify the manufacture.

The electroacoustic transducer 1 comprises a frame (not represented) delimiting at least in part a first zone 11 and a second zone 12, an element 13 moveable with respect to the frame and a device 14 for transmitting a movement between the first zone 11 and the second zone 12. The first and second zones 11-12 of the electroacoustic transducer 1 are subjected to different pressures. They are isolated from each other in a sealed manner.

The moveable element 13, hereafter called piston, is in contact with the first zone 11. It comprises a membrane 131 and a structure 132 for rigidifying the membrane, also called skeleton or armature. The membrane 131 of the piston 13 here has the role of collecting over its entire surface a difference in pressure between its two faces, to deduce therefrom a variation in atmospheric pressure.

The membrane 131 of the piston 13 delimits in part a so-called closed reference volume, where a reference pressure reigns. It separates this reference volume from a cavity open to the external environment, here the air. A face of the membrane 131 is thus subjected to the reference pressure and an opposite face of the membrane 131 is subjected to atmospheric pressure (of which it is wished to detect the variation in the case of a microphone).

The first zone 11 may correspond to the cavity open to the external environment, and thus be subjected to atmospheric pressure. Alternatively, the first zone 11 may be the reference volume subjected to the reference pressure.

Further, in this particular example, the electroacoustic transducer 1 comprises a capacitive detection device 15 arranged in the second zone 12. The capacitive detection device 15 makes it possible to measure the displacement of the piston 13, and thus the difference in pressure between its two faces. It desirably comprises a moveable electrode 151 and at least one fixed electrode arranged opposite the moveable electrode 151. The electrodes form the armatures of a capacitor, the capacitance of which varies as a function of the displacement of the piston 13.

The second zone 12 is a controlled atmosphere chamber to reduce phenomena of viscous friction and associated acoustic noises. "Controlled atmosphere chamber" is taken to mean a chamber under reduced pressure, typically less than 10 mbar, and desirably under vacuum.

The transmitting device 14 is mounted rotationally moveable with respect to the frame, by means of one or more pivot articulations 16. The transmitting device 14 comprises at least one first transmission arm 141 extending into the first zone 11, at least one second transmission arm 142 extending into the second zone 12 and at least one transmission shaft 143 extending in part into the first zone 11 and in part into the second zone 12. In the example of FIG. 1, the transmitting device 14 comprises two first transmission arms 141, two second transmission arms 142 and two transmission shafts 143, each transmission shaft 143 connecting a first transmission arm 141 to a second transmission arm 142.

Each first transmission arm 141 comprises a first end coupled to the piston 13 and a second opposite end, coupled to the associated transmission shaft 143. Each second transmission arm 142 comprises a first end coupled to the moveable electrode 151 of the capacitive detection device 15 and a second opposite end, coupled to the associated transmission shaft 143.

The transmission shaft 143 is for example of straight cylinder shape. The transmission arms 141-142 desirably have the shape of a beam of rectangular section, with one dimension (length) much greater than the others (width and thickness). The piston 13 has for example a rectangular shape. The first transmission arms 141 desirably extend perpendicularly to a side of the piston 13, beneficially a large side. They may be anchored inside the periphery of the piston 13, as is represented by FIG. 1, for example by means of a first end of cylindrical shape.

Each pivot articulation 16 desirably comprises a sealed isolation element 161, traversed by a transmission shaft 143, and two aligned blades 162, which extend between the transmission shaft 143 and the frame. The sealed isolation element 161 is for example in the form of a sealing membrane. It ensures the sealing between the first zone 11 and the second zone 12 at the level of the pivot articulation 16. The blades 162 are dimensioned so as to be able to deform torsionally and enable the rotation of the transmitting device 14. They are desirably arranged in a diametrically opposite manner with respect to the transmission shaft 143. In an embodiment, the sealed isolation element 161 is such that it also deforms under the effect of the rotational displacement of the transmitting device 14.

The frame may notably comprise a support (formed by a first substrate), a structural layer (for example made of silicon) arranged on the support and a cover transferred onto the structural layer (for example formed by a second substrate).

The structure 132 for rigidifying the membrane of the piston 13 beneficially comprises at its periphery an edge which extends in a direction perpendicular to the membrane 131. This edge increases the air path around the piston and reduces leakages between the external environment and the closed volume serving as reference.

FIGS. 2A to 2H represent steps S1 to S8 of a method for manufacturing the electroacoustic transducer 1. These figures show in what way the piston 13 may be formed and detached from the frame. Only a portion of the electroacoustic transducer, in the vicinity of the periphery of the piston 13, is thus represented. For reasons of simplification, reference will only be made to a single first transmission arm 141, a single pivot articulation 16, a single sealing membrane 161, etc., it being understood that all the elements of a same type may be formed simultaneously.

Figure 2A:
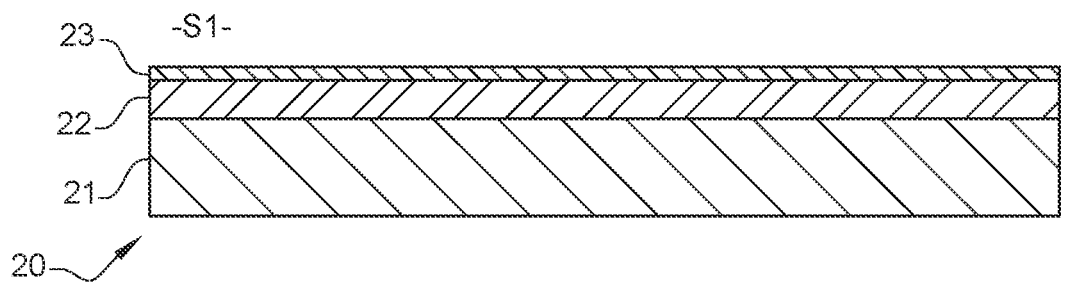
FIG. 2A to FIG. 2H represent the steps of a method for manufacturing the electroacoustic transducer according to FIG. 1.

FIG. 2A The first step S1 represented by FIG. 2A consists in providing a stack of layers 20 serving as starting material for the production of the transducer. The stack 20 successively comprises a substrate 21, a first sacrificial layer 22 and a first structural layer 23, also called "thin layer". The first sacrificial layer 22 and the first structural layer 23 are arranged on a so-called main face (also called front face) of the substrate 21.

The substrate 21 serves notably to produce the first transmission arm 141 and a portion of the frame (the support). It initially has a thickness that may be comprised between 500 μm and 700 μm. The substrate 21 may be made of a semiconductor material, for example silicon.

The first structural layer 23 serves to produce the membrane 131 of the piston 13. It may also serve to produce the sealing membrane 161 of the pivot articulation 16 and/or the moveable electrode 151 of the capacitive detection device 15. It has a thickness less than that of the substrate 21, desirably comprised between 100 nm and 10 μm, for example equal to 1 μm. It is desirably constituted of the same material as the substrate, for example silicon.

The first sacrificial layer 22 is meant to disappear in part during the production of the transducer. This layer is notably useful for delimiting the first transmission arm 141. It may also serve as lower air gap in the capacitive detection zone of the transducer. It may also make it possible to mechanically connect the substrate and the first structural layer. The first sacrificial layer 21 may be constituted of a dielectric material, desirably a silicon nitride or a silicon oxide, for example silicon dioxide ($SiO_2$). Its thickness is for example comprised between 100 nm and 10 μm.

The stack 20 may notably be a multilayer structure of SOI (Silicon On Insulator) type, commonly called SOI substrate.

Although not represented by the figures, the manufacturing method may next comprise a step of etching of the first structural layer 23. This step of etching of the first structural layer 23 may notably serve to form holes for releasing the moveable electrode 151 (to allow the etching solution of the first sacrificial layer 22 to infiltrate later).

Figure 2B:
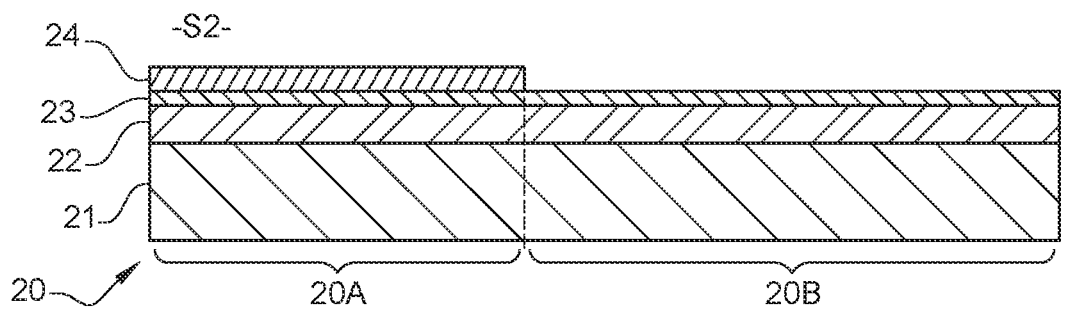

FIG. 2B At step S2 of FIG. 2B, a second sacrificial layer 24 is formed on the first structural layer 23 in a first zone 20A of the stack 20. To do so, the second sacrificial layer 24 may be firstly deposited so as to cover entirely the first structural layer 23 then etched partially in a second zone 20B of the stack 20, for example through a resin mask formed by photolithography. The etching of the second sacrificial layer 24 is desirably selective with respect to the first structural layer 23. The second sacrificial layer 24 is beneficially formed of the same dielectric material as the first sacrificial layer 22, for example a silicon oxide. Its thickness may be comprised between 100 nm and 10 μm.

The second sacrificial layer 24 may serve as upper air gap for the capacitive detection. The etching of the second sacrificial layer 24 may lead to the etching of the first sacrificial layer 22, in the place where the first structural layer 23 has previously been etched (not represented in the figures).

Figure 2C:
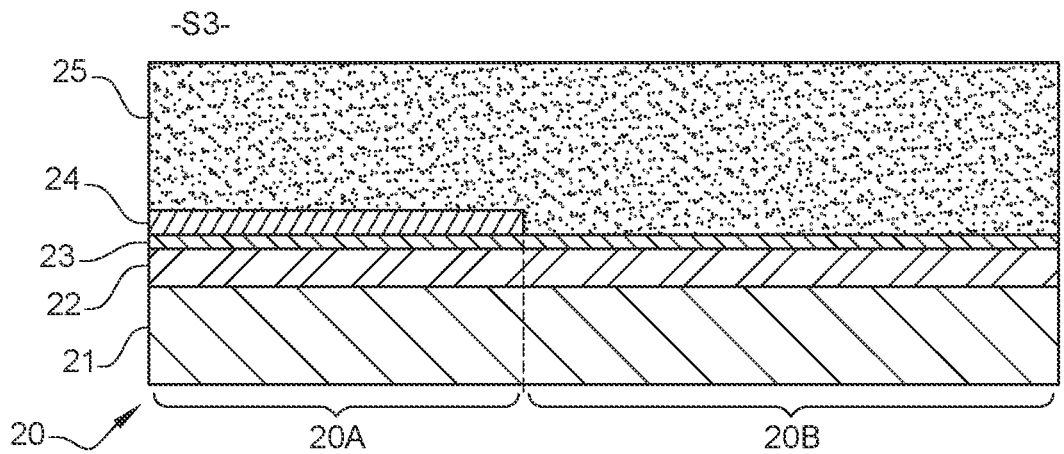

FIG. 2C At step S3 of FIG. 2C, a second structural layer 25 is deposited on the first structural layer 23 (in the second zone 20B of the stack 20) and on the second sacrificial layer 24 (in the first zone 20A of the stack 20), for example by epitaxy. The second structural layer 25 is intended to form one or more (structural) elements of the transducer, in particular the rigidification structure 132 of the piston 13. It is beneficially formed of the same material as the first structural layer 23, for example silicon. The thickness of the second structural layer 25 is desirably comprised between 5 μm and 50 μm, for example equal to 20 μm.

Figure 2D:
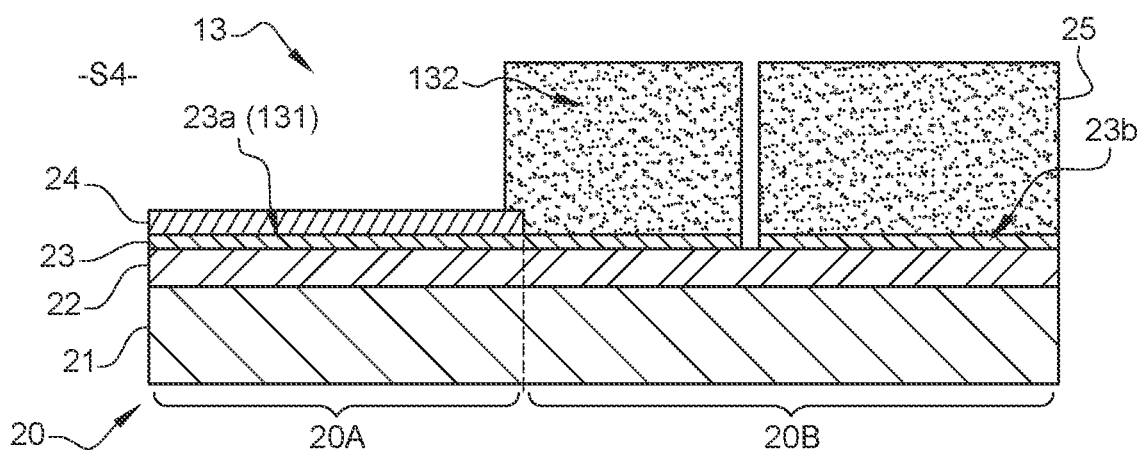

FIG. 2D Then, during a step S4 represented by FIG. 2D, the second structural layer 25 is etched so as to delimit the contours of the rigidification structure 132 (trimming of the piston) and to lighten the piston 13. In the first zone 20A of the stack 20, the second sacrificial layer 24 (e.g. made of silicon oxide) serves as stop layer to the etching of the second structural layer 25 (e.g. made of silicon), thereby preserving the underlying first structural layer 23 (e.g. made of silicon). The etching of the second structural layer 25 is thus selective with respect to the second sacrificial layer 24. On the other hand, in the second zone 20B of the stack 20, the etching of the second structural layer 25 to delimit the periphery (or the outer contour) of the rigidification structure 132 opens into the first structural layer 23. The etching of the second structural layer 25 not being selective with respect to the first structural layer 23 (but uniquely with respect to the first sacrificial layer 22), the first structural layer 23 is etched at the same time as the second structural layer 25 down to the first sacrificial layer 22.

Thus, at the bottom of the trench corresponding to the periphery of the rigidification structure 132, the first structural layer 23 has been etched and the first sacrificial layer 22 is exposed.

At the end of step S4, the first structural layer 23 comprises a first portion 23a and a second portion 23b separated from each other. The first portion 23a of the first structural layer 23 (on the left of FIG. 2D) is intended to form the membrane 131 of the piston 13. It is covered by the second sacrificial layer 24 and by a detached portion of the second structural layer 25 forming the rigidification structure 132 of the piston 13.

The etching technique employed at step S4 of FIG. 2D is beneficially DRIE (Deep Reactive Ion Etching).

Figure 2E:
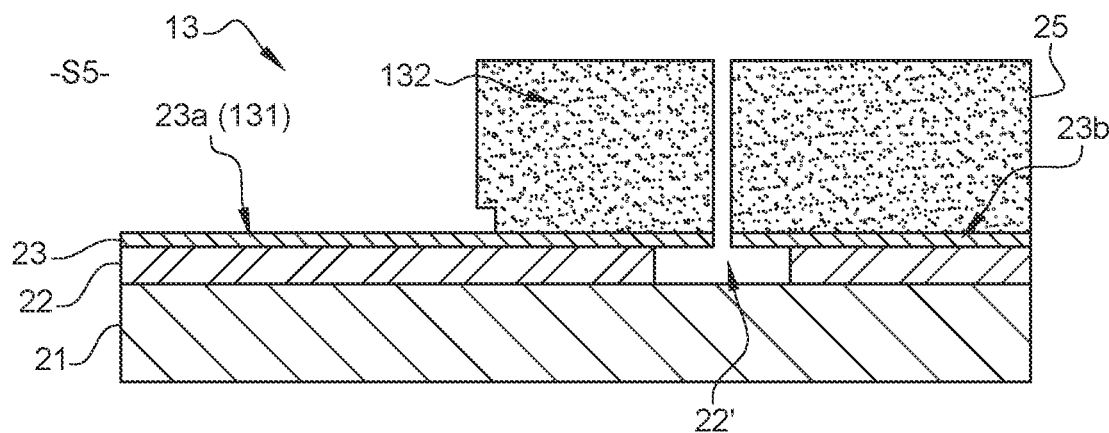

FIG. 2E With reference to FIG. 2E, the manufacturing method next comprises a step S5 of etching of the second sacrificial layer 24 so as to expose (partially) the first portion 23a of the first structural layer 23 (in other words so as to expose a first face of the membrane 131). This step S5 may be qualified as first step of releasing the piston 13.

The etching of the second sacrificial layer 24 is desirably an isotropic etching selective with respect to the substrate 21, to the first structural layer 23 and to the second structural layer 25. The second sacrificial layer 24 is desirably etched chemically, for example by immersing the stack in a hydrofluoric (HF) acid bath in liquid or vapour phase (in the case of a layer made of silicon oxide) for a controlled time.

On the other hand, a portion of the first sacrificial layer 22 situated in line with the periphery of the rigidification structure 132 is etched at the same time as the second sacrificial layer 24, which forms a cavity 22' in the first sacrificial layer 22. The etching may be time controlled such that this cavity 22' is not very extended.

The etching of the sacrificial layers 22 and 24 may also serve to release the moveable electrode 151 of the capacitive detection device 15 (before it is enclosed in the controlled atmosphere chamber).

Although not represented by the figures, the manufacturing method may next comprise a step of transfer of a cover onto the second structural layer 25, thereby forming the controlled atmosphere chamber, that is to say the second zone 12. The cover may be produced by machining a silicon substrate. It may notably be fixed to the second structural layer 25 by direct bonding (for example Si—Si) or by eutectic sealing (for example Au—Si).

Figure 2F:
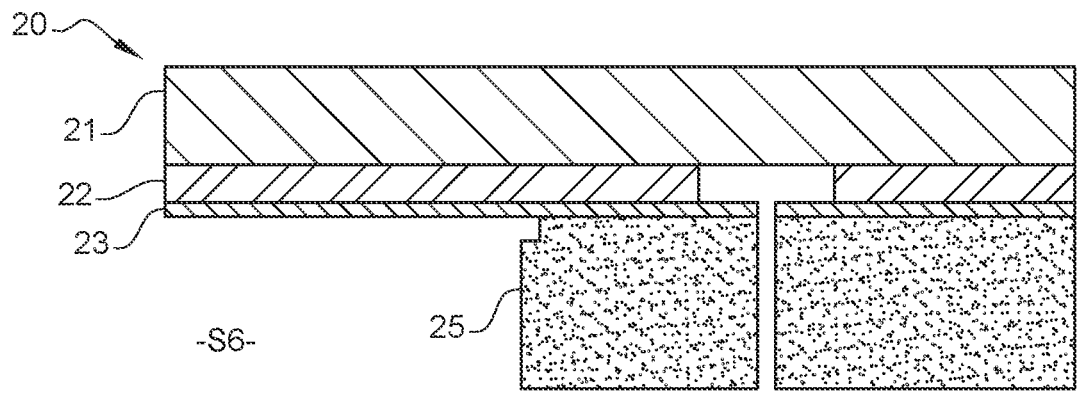

FIG. 2F Then, at step S6 of FIG. 2F, the assembly formed by the stack of layers 20 and the cover (not represented) is turned over, to facilitate the later etching of the substrate 21. After this turning over, the substrate 21 is beneficially thinned, for example by DRIE, grinding and/or chemical mechanical polishing (CMP), desirably up to reaching a thickness comprised between 30 μm to 300 μm, i.e. the desired thickness for the first transmission arm 141.

Figure 2G:
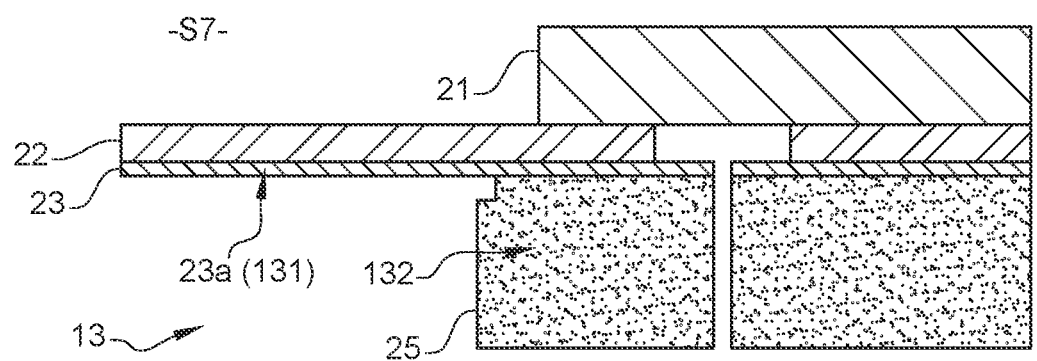

FIG. 2G Step S7 of FIG. 2G consists in etching the substrate 21 (optionally thinned) to the first sacrificial layer 22 so as to create an access up to the piston 13 and to delimit, in a zone not represented in FIG. 2G, the first transmission arm. The etching of the substrate is desirably selective with respect to the first sacrificial layer 22. The substrate 21 may be etched by DRIE.

As is illustrated in FIG. 2G, the etching of the substrate 21 to create an access towards the rear face of the piston 13 may be inscribed inside the periphery of the piston 13, so as not to open into the cavity 22' formed at step S5 (cf. FIG. 2E) by the partial (and involuntary) etching of the first sacrificial layer 22. Thus, the etching of step S7 does not extend to the piston 13 comprising the first portion 23a of the first structural layer 23 (membrane 131) and the detached portion of the second structural layer 25 (rigidification structure 132). Inside the periphery of the piston 13, the first sacrificial layer 22 (e.g. made of silicon oxide) serves as stop layer to the etching of the substrate 21 (e.g. made of silicon), thereby preserving the first portion 23a of the underlying first structural layer 23 (e.g. made of silicon).

Finally, at step S8 (cf. FIG. 2H), the first sacrificial layer 22 is etched so as to reveal the first portion 23a of the first structural layer 23 (in other words so as to expose a second opposite face of the membrane 131) and to detach it from the substrate 21. At the end of step S8, the piston 13 is free to be displaced. Step S8 may thus be qualified as second step of releasing the piston 13.

The etching of the first sacrificial layer 22 is desirably an isotropic etching selective with respect to the substrate 21, to the first structural layer 23 and to the second structural layer 25. The first sacrificial layer 22 is desirably etched chemically, for example by immersing the assembly in a hydrofluoric (HF) acid bath in liquid or vapour phase (in the case of a layer made of silicon oxide) for a controlled time.

Figure 2H:
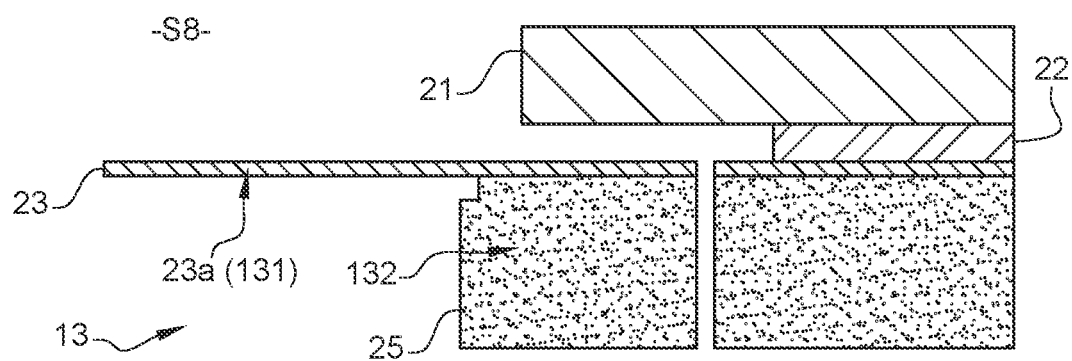
Figure 3:
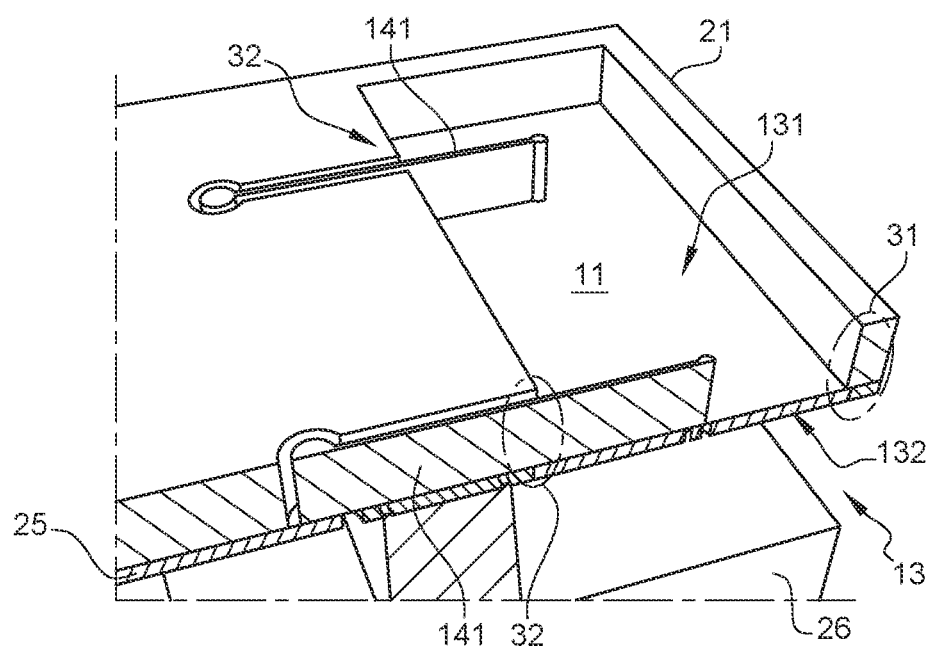
FIG. 3 is a perspective view of the electroacoustic transducer after the step of releasing the membrane of the piston represented by FIG. 2H.

FIG. 3 is a perspective view of the assembly after the second step S8 of releasing the piston (FIG. 2H), sectioned along the symmetry plane of a transmission arm 141. A portion of the cover 26 transferred onto the second structural layer 25 is represented therein.

The first region 31 situated at the periphery of the rigidification structure 132 is that represented in transversal section by FIG. 2H.

This figure shows that the vertical projection (i.e. perpendicular to the substrate) of the first transmission arm 141 traverses the periphery of the rigidification structure 132 of the piston 13. Yet, to the vertical of this periphery is found the cavity 22' formed by etching of the first sacrificial layer 22.

Thus, in a second region 32 of the stack around an intersection between the projection (or the position) of the first transmission arm 141 and the periphery of the rigidification structure 132, the etching of the substrate 21 coincides with the etching (undergone) of the first sacrificial layer 22. The first sacrificial layer 22 can thus no longer serve as stop layer to the etching of the substrate 21. This etching is not interrupted and extends into the first structural layer 23 and into the second structural layer 25. Such a phenomenon is problematic because it creates important air leakages between the first zone 11 situated on one side of the first structural layer 23 and the volume situated on the opposite side of the first structural layer 23 (here under the cover 26). This leakage problem is posed naturally at each first transmission arm 141, when the transmitting device has several thereof.

Furthermore, during the displacement of the piston 13, air is squeezed between the rigidification structure 132 and the remaining portion of the substrate 21, and this is so over almost the entire periphery of the piston 13 (cf. FIGS. 2H & 3). This air squeezing is due to the fact that the etching of the substrate 21 is inscribed inside the periphery of the piston 13. It is at the origin of a squeeze-film damping phenomenon, which generates mechanical noise and leads to a decrease in the performances of the transducer. The force of this squeeze-film damping phenomenon is inversely proportional to the cube of the overlap distance between the piston 13 and the frame (i.e. here the remaining portion of the substrate 21).

FIGS. 4B, 4D, 4E and 4G illustrate in transversal sectional view a different way of accomplishing steps S2, S4, S5 and S7 of the manufacturing method, in order to limit air leakages between the first zone and the reference volume while reducing the damping phenomenon.

Figure 4B:
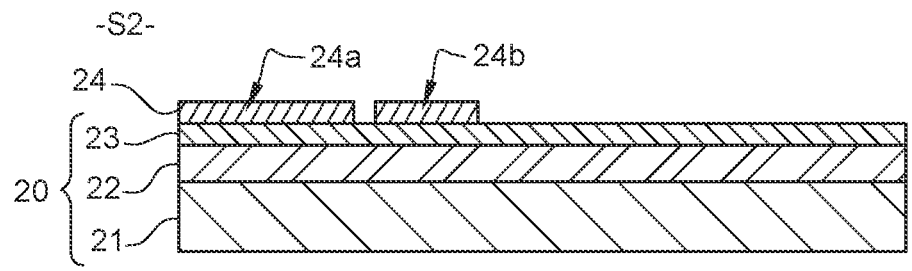
FIG. 4B, FIG. 4D, FIG. 4E and FIG. 4G represent transversal sectional view of the steps of a method for manufacturing an electroacoustic transducer according to the invention, replacing the steps of FIGS. 2B, 2D, 2E and 2G.

FIG. 4B represents step S2 of formation of the second sacrificial layer 24 on the first structural layer 23 of the stack 20. The step S2 is here accomplished such that the second sacrificial layer 24 comprises a first portion 24a and a second portion 24b distinct from the first portion 24a. Thus, with respect to step S2 of FIG. 2B, the second sacrificial layer 24 comprises (at the level of the piston) two distinct portions instead of a single portion.

The first portion 24a and the second portion 24b of the second sacrificial layer 24 are spaced apart from each other, such that the second structural layer 25 deposited later (and intended to form the rigidification structure 132) is in contact with the first structural layer 23 (intended to form the membrane 131).

The first and second portions 24a-24b of the second sacrificial layer 24 are desirably formed by etching of a dielectric layer deposited beforehand on the first structural layer 23, the etching being selective with respect to the first structural layer 23. The deposition may be conformal, such that the first and second portions 24a-24b have the same thickness. Conversely, the deposition may be planarizing if it is followed by a chemical mechanical polishing.

Figure 4D:
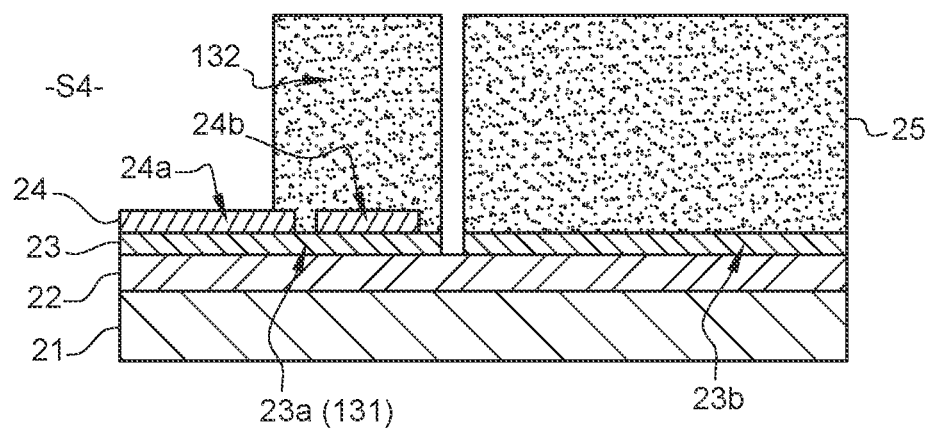

FIG. 4D represents step S4 of etching of the second structural layer 25, after its deposition on the first structural layer 23 and the second sacrificial layer 24, for example by epitaxy (step S3 of FIG. 2C). The second structural layer 25 is etched so as to expose the first portion 24a of the second sacrificial layer 24 (lightening of the piston) and to delimit the rigidification structure 132. Further, the rigidification structure 132 is dimensioned so as to cover entirely the second portion 24b of the second sacrificial layer 24. The second portion 24b of the second sacrificial layer 24, arranged on the first structural layer 23, is then encapsulated by the rigidification structure 132.

As described previously with reference to FIG. 2D, the first structural layer 23 may be etched during the same step S4 to delimit the membrane 131 (such is generally the case when the first structural layer 23 and the second structural layer 25 are formed of the same material). The first structural layer 23 is thereby separated into two portions: a first portion 23a forming the membrane 131 of the piston and a second portion 23b belonging to the frame of the transducer.

An alternative consists in etching the second structural layer 25 and the first structural layer 23 separately, using different etching chemistries, when the two layers are formed of different materials.

Figure 4E:
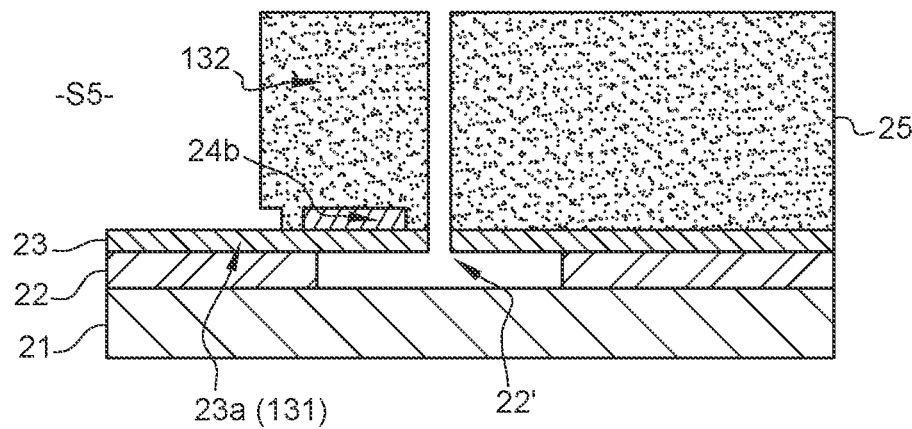

FIG. 4E At step S5 of FIG. 4E, the second sacrificial layer 24 is etched in the manner described with reference to FIG. 2E (etching selective with respect to the substrate 21, to the first structural layer 23 and to the second structural layer 25), up to removing entirely the first portion 24a. Simultaneously, a portion of the first sacrificial layer 22 is etched, starting from the bottom of the trench corresponding to the periphery of the rigidification structure 132, thereby forming the cavity 22'.

Since the second portion 24b of the second sacrificial layer 24 is surrounded by the material of the first structural layer 23 and the material of the second structural layer 25, it is not affected by the etching.

The cavity 22' extends under the second portion 24b of the second sacrificial layer 24, without however going beyond. The etching is in fact time controlled such that the lateral end of the cavity 22' is situated in line with the second portion 24b.

Figure 4G:
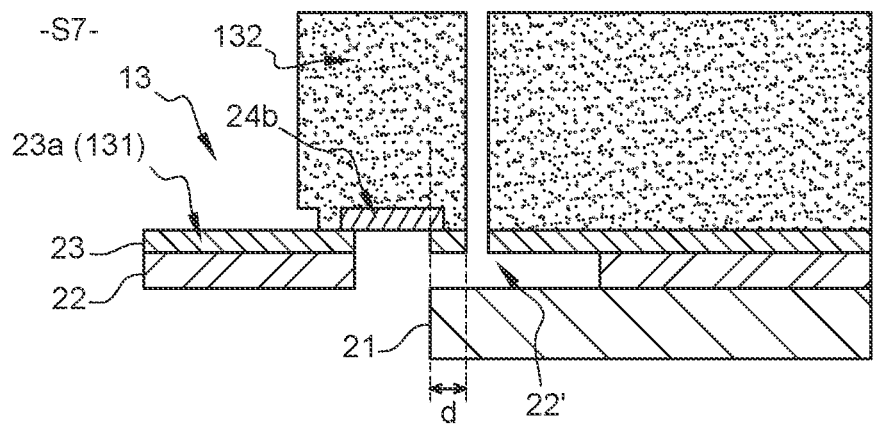

FIG. 4G represents step S7 of etching of the substrate 21 (potentially after transfer of the cover and/or turning over of the assembly; step S6 of FIG. 2F), making it possible to access the rear face of the piston 13 and to delimit the first transmission arm 141 (cf. FIG. 3). Unlike the manner described in relation with FIG. 2G, the substrate 21 is here etched so as to open into the cavity 22' formed at step S5 of FIG. 4E. This has the consequence that the piston 13 is henceforth free to be displaced.

Since the etching of the substrate 21 is selective with respect to the material of the first sacrificial layer 22 and to the material of the second sacrificial layer 24, the etching does not propagate either to the membrane 131, or to the rigidification structure 132. Indeed, the first sacrificial layer 22 and the second portion 24b of the second sacrificial layer 24 serve as stop layers to the etching (the second portion 24b of the second sacrificial layer 24 is revealed by the etching of a portion of the first structural layer 23, not protected by the first sacrificial layer 22).

Thus, the second portion 24b of the second sacrificial layer 24 makes it possible not only to limit leakages on either side of the piston, while serving as shield during the etching of the substrate 21, but also to reduce the distance d over which the substrate 21 and the rigidification structure 132 are superimposed. The phenomenon of squeeze-film damping is then reduced with respect to the configuration of FIG. 2G. The overlap distance d between the substrate 21 and the rigidification structure 132 is measured parallel to the main face of the substrate 21 in the transversal sectional plane of FIG. 4G, in other words in the direction of the width of the rigidification structure 132. It is beneficially less than 10 µm, desirably less than 6 µm. In the case of FIG. 2G, the overlap distance is typically 15 µm.

The substrate 21 is beneficially etched in such a way that it is superimposed in part with the second portion 24b of the second sacrificial layer 24 after etching. Thus, the edge of the rigidification structure 132 is not cut down.

The manufacturing method is completed by step S8 of etching the first sacrificial layer 22, as described in relation with FIG. 2H. The second portion 24b of the second sacrificial layer 24 may be etched simultaneously (notably when it is formed of the same material).

Figure 5:
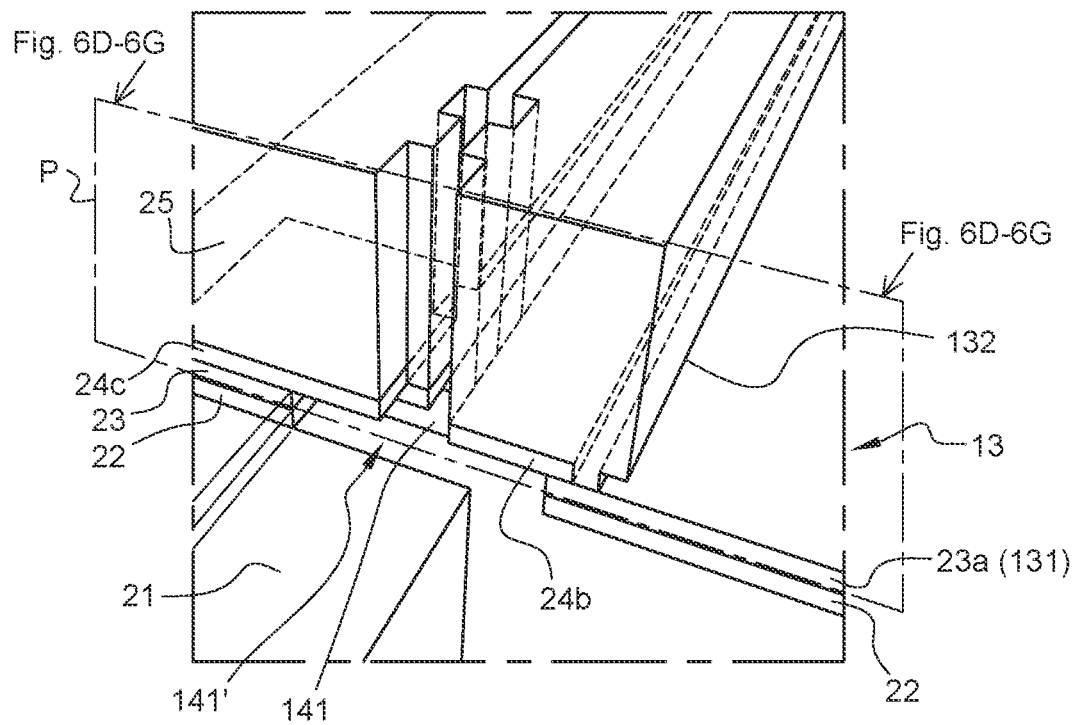
FIG. 5 is a partial perspective view of the electroacoustic transducer, after the step of FIG. 4G has been accomplished.

FIG. 5 is a partial perspective view of the electroacoustic transducer after step S7 of etching of the substrate 21. The second structural layer 25 has been made transparent.

This figure shows that the second portion 24b of the second sacrificial layer 24 is situated under the rigidification structure 132 and may extend around the membrane 131, over a large part of the periphery of the piston 13, typically more than 80% of the periphery of the piston 13, and desirably more than 90%. In an embodiment, the second portion 24b is situated all around the membrane 131. Indeed, the cavity 22' formed in the first sacrificial layer 22 extends along the periphery of the rigidification structure 132. It is thus desirable to protect the rigidification structure 132 over the entire perimeter of the piston 13, in order to minimise leakages.

When the second portion 24b of the second sacrificial layer 24 does not extend all around the membrane (for example over 80% of the periphery), the membrane 131 may only be released completely at the end of step S8 of etching of the first sacrificial layer 22. Indeed, a portion of the first sacrificial layer 22 may connect the membrane 131 to the substrate 21, as illustrated by FIG. 2G (the etching of the substrate 21 may not open into the cavity 22' in the remaining 20% of the periphery).

Figure 6D:
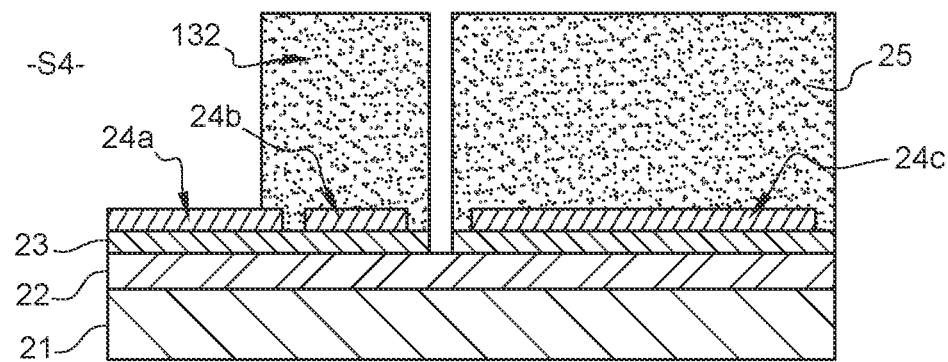
FIG. 6D and FIG. 6G represent the steps of FIGS. 4D and 4G, along a sectional plane P represented in FIG. 5, this sectional plane being different from that of FIGS. 4D and 4G.
Figure 6G:
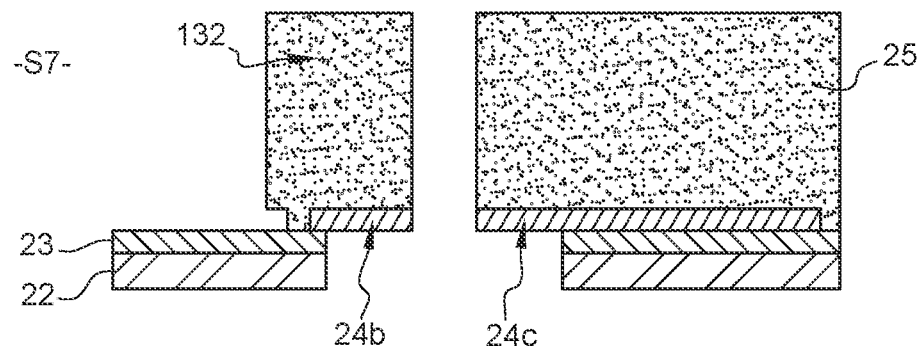

In an embodiment of the manufacturing method, represented by FIGS. 5, 6D and 6G, a third portion 24c of the second sacrificial layer 24 is formed at step S2 (at the same time as the first and second portions 24a-24b) and encapsulated between the first structural layer 23 and the remaining portion of the second structural layer 25 at step S4 (cf. FIG. 6D). This third portion 24c is distinct from the first and second portions 24a-24b and serves to protect the remaining portion of the second structural layer 25 (belonging to the frame) during the etching of the substrate 21 (step S7; FIG. 6G).

With reference to FIG. 5, the substrate 21 is in fact etched to delimit the first transmission arm 141. Two trenches 141' (here rectilinear) are then formed on either of the first transmission arm 141. These trenches 141' open into the cavity 22', given that they extend along the first transmission arm 141 and cross the periphery of the rigidification structure 132.

The third portion 24c of the second sacrificial layer 24 is thus encapsulated by the remaining portion of the second structural layer 25, in the vicinity of the crossover between the first transmission arm 141 and the periphery of the rigidification structure 132 (in other words in the second region 32 of the stack, cf. FIG. 3), and serves as shield to the etching of the substrate 21 uniquely in this region. It thus does not need to be as extended as the second portion 24b.

FIGS. 6D and 6G represent in section the electroacoustic transducer at the end of steps S4 and S7 respectively, but along a sectional plane P different to that of FIGS. 4D and 4G and visible in FIG. 5. The sectional plane P of FIGS. 6D and 6G passes through one of the trenches 141' bordering the first transmission arm 141 (reason why neither the first transmission arm 141, nor any other portion of substrate 21, appears in FIG. 6G).

As is represented in FIGS. 5 and 6G, the etching of the substrate 21 leads to a supplementary etching of the second structural layer 25 between the second and third portions 24b-24c of the second sacrificial layer 24 serving as shields. The etched portion of the second structural layer 25 is very little extended (several micrometres squared), because the etching only takes place vertically to the trenches 141' delimiting the first transmission arm 141. Supplementary air leakages are thus not important and the behaviour of the electroacoustic transducer is not altered.

The method for manufacturing the electroacoustic transducer according to the invention has been described in taking for example a capacitive detection microphone (FIG. 1), one face of which is subjected to atmospheric pressure and the other face subjected to a reference pressure. The manufacturing method described in relation with FIGS. 2A-2H and 4B-4G, is however applicable to other types of microphone and to other types of electroacoustic transducer, notably a loudspeaker (sound emitter) or ultrasound emitter.

More generally, a microphone comprises in the second zone 12 (controlled atmosphere chamber) a device for measuring a movement of the transmitting device and/or a force applied to the transmitting device. This measurement device comprises for example a vibrating beam (resonant detection microphone).

In the case of a loudspeaker or an ultrasound emitter, an actuator (for example capacitive) replaces the measuring means in the second zone 22. The actuator moves the first end of the second transmission arm 142. This movement is transmitted by the transmitting device 14 to the piston 13 integral with the first end of the first transmission arm 141. The movement of the membrane 131 of the piston 13 makes it possible to emit a sound (or ultrasounds).

The invention claimed is:

1. A method for manufacturing an electroacoustic transducer comprising:
   a frame;
   an element moveable with respect to the frame, the moveable element comprising a membrane and a structure for rigidifying the membrane;
   a first transmission arm, the moveable element being coupled to an end of the first transmission arm;
the method comprising:
   providing a stack successively comprising a substrate, a first sacrificial layer and a first structural layer;
   forming a second sacrificial layer on the first structural layer, the second sacrificial layer comprising disjointed first and second portions;
   forming a second structural layer on the first structural layer and the second sacrificial layer;
   etching the second structural layer so as to expose the first portion of the second sacrificial layer and to delimit the rigidification structure of the moveable element, the second portion of the second sacrificial layer being encapsulated by the rigidification structure;
   etching the first structural layer to the first sacrificial layer so as to delimit the membrane of the moveable element;
   etching the first portion of the second sacrificial layer so as to expose a first face of the membrane and to etch a portion of the first sacrificial layer, thereby forming a cavity which extends under the rigidification structure;
   etching the substrate so as to delimit the first transmission arm and to release at least partially the moveable element while opening into the cavity, the first sacrificial layer and the second portion of the second sacrificial layer serving as stop layer to the etching; and etching the first sacrificial layer so as to expose a second opposite face of the membrane.

2. The method according to claim 1, wherein the second portion of the second sacrificial layer extends around the membrane of the moveable element, over more than 80% of the periphery of the moveable element.

3. The method according to claim 1, wherein the second sacrificial layer further comprises a third portion disjointed from the first and second portions, the third portion of the second sacrificial layer being arranged so as to be encapsulated by a remaining portion of the second structural layer after the step of etching the second structural layer, the third portion of the second sacrificial layer also serving as stop layer during the step of etching the substrate.

4. The method according to claim 3, wherein the third portion of the second sacrificial layer is situated in the vicinity of an intersection between the position of the first transmission arm and the periphery of the rigidification structure.

5. The method according to claim 1, wherein the first structural layer and the second structural layer are etched simultaneously so as to delimit the membrane and the rigidification structure of the moveable element.

6. The method according to claim 1, further comprising, after etching the first and second sacrificial layers and before etching the substrate:
   arranging a cover on the second structural layer, thereby forming an assembly; and
   turning over the assembly.

7. The method according to claim 1, wherein the stack is a multilayer structure of silicon on insulator (SOI) type.

8. The method according to claim 1, wherein the substrate is made of silicon, the first sacrificial layer is made of silicon oxide and the first structural layer is made of silicon.

9. The method according to claim 1, wherein the second sacrificial layer is made of silicon oxide.

10. The method according to claim 1, wherein the first structural layer has a thickness comprised between 100 nm and 10 µm.

11. An electroacoustic transducer comprising:
   a frame;
   an element moveable with respect to the frame, the moveable element comprising a membrane and a structure for rigidifying the membrane;
   a first transmission arm, the moveable element being coupled to an end of the first transmission arm;
   the membrane being formed by a first portion of a first structural layer, the rigidification structure being formed by a portion part of a second structural layer arranged on the first structural layer and the frame comprising a substrate, a second portion of the first structural layer and a second portion of the second structural layer,
   wherein the substrate and the rigidification structure are superimposed over a distance less than 10 µm, said distance being measured in a transversal sectional plane of the rigidification structure.

12. The electroacoustic transducer according to claim 11, comprising a device for transmitting a movement and a force between a first zone and a second zone with a controlled atmosphere, the first and second zones being isolated from each other in a sealed manner, the transmitting device comprising, apart from the first transmission arm which extends into the first zone, a second transmission arm extending into the second zone.

* * * * *